United States Patent
Broermann

(10) Patent No.: US 6,897,422 B2
(45) Date of Patent: May 24, 2005

(54) MEASURING CONFIGURATION AND METHOD FOR MEASURING A CRITICAL DIMENSION OF AT LEAST ONE FEATURE ON A SEMICONDUCTOR WAFER

(75) Inventor: Oliver Broermann, Dresden (DE)

(73) Assignee: Infineon Technologies AG, Munich (DE)

( * ) Notice: Subject to any disclaimer, the term of this patent is extended or adjusted under 35 U.S.C. 154(b) by 127 days.

(21) Appl. No.: 10/196,834

(22) Filed: Jul. 17, 2002

(65) Prior Publication Data

US 2003/0015674 A1 Jan. 23, 2003

(30) Foreign Application Priority Data

Jul. 17, 2001 (DE) .......................................... 101 34 755

(51) Int. Cl.[7] .................................................. G02B 7/04
(52) U.S. Cl. ..................................................... 250/201.6
(58) Field of Search ............................. 250/201.6, 306; 414/217

(56) References Cited

U.S. PATENT DOCUMENTS

| | | | | |
|---|---|---|---|---|
| 5,216,235 A | * | 6/1993 | Lin ......................... | 250/201.6 |
| 5,805,290 A | | 9/1998 | Ausschnitt et al. | |
| 5,867,276 A | | 2/1999 | McNeil et al. | |
| 6,137,303 A | | 10/2000 | Deckert et al. | |
| 6,392,229 B1 | * | 5/2002 | Dana et al. ................. | 250/306 |
| 6,425,722 B1 | * | 7/2002 | Ueda et al. ................. | 414/217 |

FOREIGN PATENT DOCUMENTS

| | | |
|---|---|---|
| DE | 199 22 614 A1 | 6/2000 |
| WO | WO 00/58713 | 10/2000 |
| WO | WO 01/09020 A1 | 2/2001 |

OTHER PUBLICATIONS

Michael Brain et al.: "Emerging Needs For Continuous Flow FOUP Transport", 1999 *IEEE/CPMT Int'l Manufacturing Technology Symposium*, pp. 76–82.

* cited by examiner

*Primary Examiner*—John F. Niebling
*Assistant Examiner*—Andre' C. Stevenson
(74) *Attorney, Agent, or Firm*—Laurence A. Greenberg; Werner H. Stemer; Gregory L. Mayback

(57) ABSTRACT

A scanning electron microscope is integrated in a common measuring configuration with at least one device for the angle-dependent measuring of the scattering or diffraction of light. This measuring configuration includes a common transport system, which handles the distribution of semiconductor wafers that are to be measured. The measuring configuration also includes at least one loading and unloading station for providing semiconductor wafers in wafer transport containers. The joint configuration of the two-measuring devices for measuring the critical dimension of a feature allows a mostly contamination-free, rapid, and flexible exchange between the two measuring devices, and furthermore the measuring of lots can be planned in accordance with various measuring strategies. In particular, each semiconductor wafer of a lot can be measured without resorting to sampling strategies. Certainty is enhanced with respect to wafer-to-wafer uniformity, and a greater throughput is achieved.

14 Claims, 2 Drawing Sheets

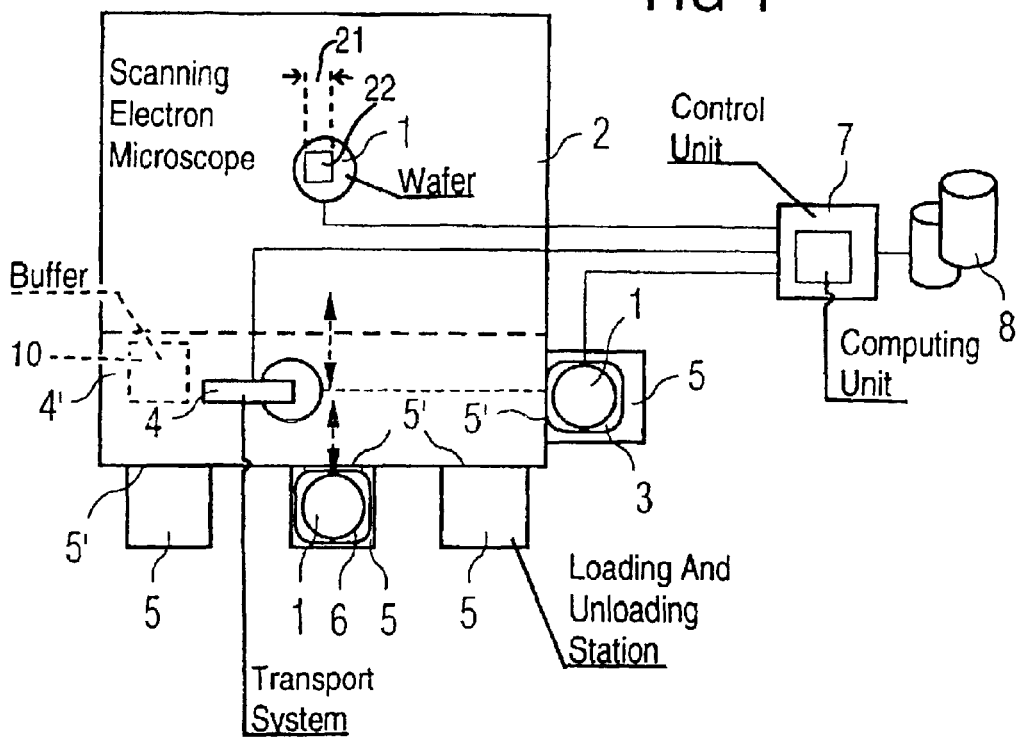
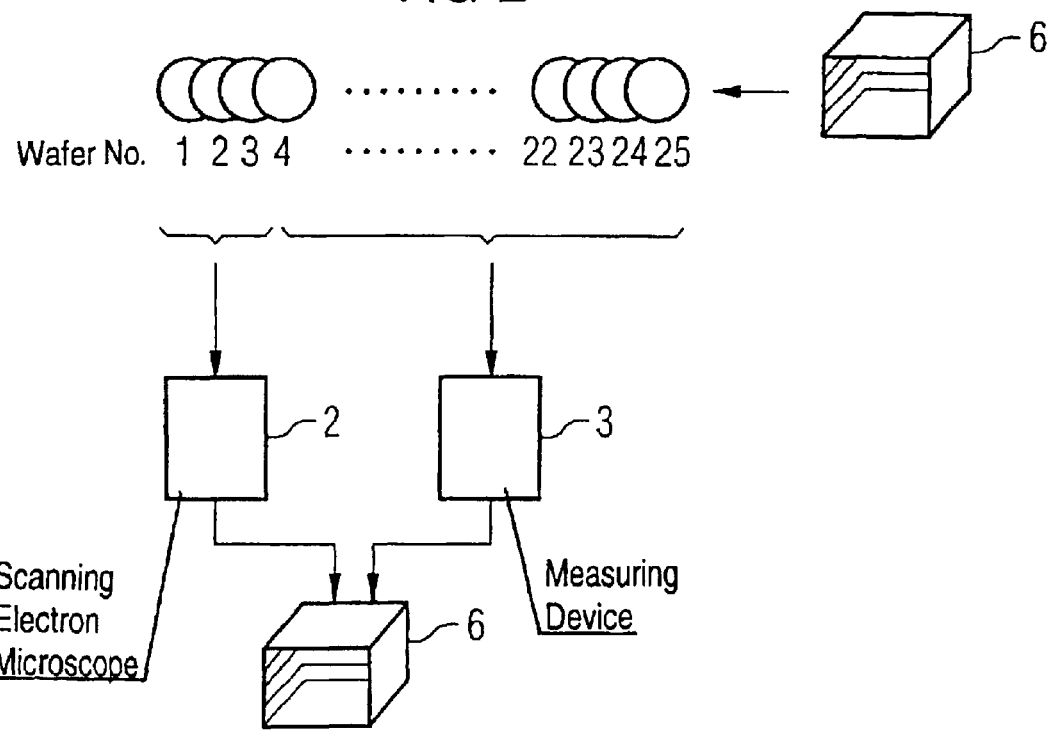

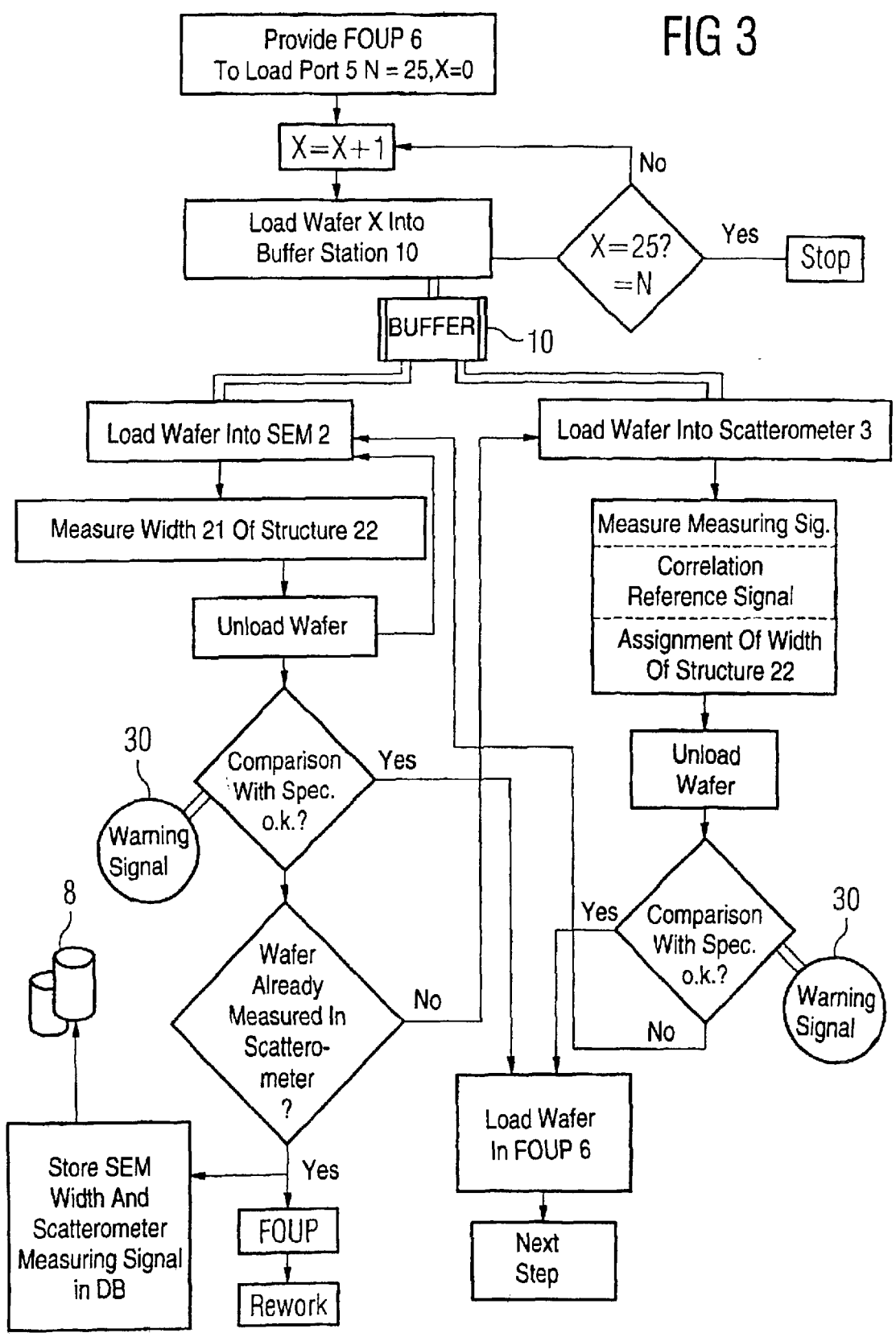

MEASURING CONFIGURATION AND METHOD FOR MEASURING A CRITICAL DIMENSION OF AT LEAST ONE FEATURE ON A SEMICONDUCTOR WAFER

BACKGROUND OF THE INVENTION

Field of the Invention

The invention relates to a measuring configuration and a method for measuring a critical dimension of at least one feature on a semiconductor wafer.

In the quality assurance during the manufacturing of semiconductor products a substantial portion of the fabrication time and the costs of fabricating a semiconductor product is taken up by metrology, i.e. the determination of the spacing and size of features on a substrate. Nowadays, due to the progressively smaller feature sizes, conventional optical microscopes often no longer suffice for determining the feature sizes for comparison to predetermined specifications.

The term feature is used hereinafter for material elevations on a substrate such as lines, pads, etc., and for holes and gaps or trenches therein. In what is known as a lines and spaces pattern, a feature can mean a line or a (neighboring) gap or trench, or a combination of the two. The spacing between two lines then corresponds precisely to the gap width.

For orders of magnitude at the limit of resolution of the projection of a mask onto a wafer, the measuring of a critical dimension (CD) of features which are imaged on the semiconductor wafer such as lengths, widths, heights, angles of edge inclination, etc. for purposes of comparison with dimensions prescribed by the circuit layout, for instance of an integrated circuit, is carried out more and more commonly with the aid of a scanning electron microscope (SEM). However, due to the high resolution and the small image section associated with this, on one hand, and the increasing wafer sizes (currently 300 mm), on the other hand, the currently available inspections can be performed only at points.

In order to achieve a high throughput of measurements with an SEM, 5 measuring points per wafer are typically defined, which results in a measuring time of about 1 minute per wafer for measuring the widths or spacings of the measuring points, according to the order of magnitude. For the 25-wafer lots which are typically carried together in a wafer transport container, this corresponds to a throughput of about 2 lots per hour. Such a low throughput has proven to be uneconomical for the production phase of a wafer factory, because it significantly raises the per-wafer costs due to the longer throughput time, the extra demand for equipment, and the demand for space in the clean room.

A common solution is to switch over to what are known as sampling strategies, according to which 3 wafers are initially selected from the lot and examined in the SEM. If there is sufficient agreement with the specifications from the design data in the context of the wafer specification for the critical dimension of the feature with the aid of statistical models, then it is assumed that the same is also true for the remaining 22 wafers. Otherwise, additional wafers must be examined for purposes of checking the CD, potentially with consequent repetition of the last processing steps of the wafers that violate the wafer specification. There exists a fundamental risk in sampling strategies that the uniformity of the feature dimensions from wafer to wafer may be insufficient however appears to be sufficient due to samples for which the data only coincidentally match.

SUMMARY OF THE INVENTION

It is accordingly an object of the invention to provide a measuring configuration for measuring a critical dimension of at least one feature on a semiconductor wafer which overcomes the above-mentioned disadvantages of the heretofore-known measuring configurations of this general type and which increases the degree of certainty of uniformity from one wafer to the next and/or to increase the throughput of wafers in a given time period when measuring the critical dimension of the feature. It is a further object of the invention to provide a method for measuring a critical dimension of at least one feature on at least two substantially identical semiconductor wafers.

With the foregoing and other objects in view there is provided, in accordance with the invention, a measuring configuration for measuring a semiconductor wafer having at least one feature with a critical dimension, including:

a scanning electron microscope for measuring the critical dimension of the at least one feature of the semiconductor wafer;

at least one measuring device for an angle-dependent measuring of a scattering or a diffraction of light at the at least one feature of the semiconductor wafer;

at least one loading and unloading station configured to load and unload wafer transport containers receiving the semiconductor wafer;

a transport system for transporting the semiconductor wafer, the transport system having transport paths including at least a respective transport path between the at least one loading and unloading station and the scanning electron microscope, and between the at least one loading and unloading station and the at least one measuring device for an angle-dependent measuring of a scattering or a diffraction of light; and a control unit operatively connected to the transport system, the control unit selecting and controlling one of the transport paths of the transport system in order to selectively make the semiconductor wafer available to the at least one measuring device for an angle-dependent measuring and to the scanning electron microscope.

In other words, the object of the invention is achieved by a measuring configuration for measuring a critical dimension of at least one feature on a semiconductor wafer, including a scanning electron microscope for measuring the critical dimension of the at least one feature, a device for an angle-dependent measuring of a scattering or diffraction of light at the at least one feature, at least one loading and unloading station for wafer transport containers for receiving the semiconductor wafer, a transport system for carrying the semiconductor wafer between the charging and discharging station, the scanning electron microscope, and the device for the angle-dependent measuring of the scattering or diffraction of light, and a control unit for controlling the transport system; and by a method for utilizing the measuring configuration.

According to another feature of the invention, a database is operatively connected to the at least one measuring device for an angle-dependent measuring of a scattering or a diffraction of light, the data base stores a reference signal for an angle-dependent measurement of a scattering or a diffraction of light at at least one reference feature.

According to yet another a further feature of the invention, the scanning electron microscope is operatively connected to the database in order to store a critical dimension of the at least one reference feature and a measuring signal in a common record.

According to yet another feature of the invention, the control unit includes a computing unit for correlating a measuring signal, which is measured with the at least one measuring device for an angle-dependent measuring of a scattering or a diffraction of light, with at least one reference signal stored in the database.

According to a further feature of the invention, the at least one loading and unloading station includes a first loading and unloading station and a second loading and unloading station, the first and second loading and unloading stations are configured to communicate with a same one of the transport containers; the first loading and unloading station is set up as an interface between the transport system and the at least one measuring device for an angle-dependent measuring of a scattering or a diffraction of light; and the at least one measuring device for an angle-dependent measuring of a scattering or a diffraction of light is connected to the transport system via the interface for performing a measurement of the semiconductor wafer.

According to another feature of the invention, the transport system includes a region with a buffer station for receiving the semiconductor wafer during a waiting period.

With the objects of the invention in view there is also provided, a method for measuring a critical dimension of at least one feature on at least two substantially identical semiconductor wafers, the method includes the steps of:

providing a plurality of semiconductor wafers in at least one wafer transport container;

unloading a first semiconductor wafer at a loading and unloading station;

transporting, with a transport system, the first semiconductor wafer to a scanning electron microscope;

measuring a first critical dimension of the at least one feature on the first semiconductor wafer with the scanning electron microscope;

unloading a second semiconductor wafer at the loading and unloading station;

transporting, with the transport system, the second semiconductor wafer to a measuring device for an angle-dependent measuring of a scattering or a diffraction of light;

measuring a second critical dimension of the at least one feature on the second semiconductor wafer with the measuring device for an angle-dependent measuring of a scattering or a diffraction of light;

comparing the first critical dimension to a reference value;

comparing the second critical dimension to the reference value;

generating a warning signal in dependence on results of the comparing steps;

transporting the first and second semiconductor wafers back to the loading and unloading station; and loading the at least one wafer transport container with the first and second semiconductor wafers.

Another mode of the method according to the invention includes the steps of unloading a third semiconductor wafer from the at least one wafer transport container at the loading and unloading station; transporting the third semiconductor wafer to a buffer station; checking, with a control unit, whether the scanning electron microscope is available for a further measuring; and transporting, in dependence on a result of the checking step, the third semiconductor wafer to the scanning electron microscope for measuring a third critical dimension of the at least one feature.

A further mode of the method according to the invention includes the steps of unloading a third semiconductor wafer from the at least one wafer transport container at the loading and unloading station; transporting the third semiconductor wafer to a buffer station; checking, with a control unit, whether the measuring device for an angle-dependent measuring of a scattering or a diffraction of light is available for a further measuring; and transporting, in dependence on a result of the checking step, the third semiconductor wafer to the measuring device for an angle-dependent measuring of a scattering or a diffraction of light, in order to measure a third critical dimension of the at least one feature.

Another mode of the method according to the invention includes the steps of unloading a third semiconductor wafer from the at least one wafer transport container at the loading and unloading station; and transporting, with the transport system, the third semiconductor wafer to the scanning electron microscope in dependence on the warning signal generated subsequent to measuring the first critical dimension of the at least one feature.

A further mode of the method according to the invention includes the steps of unloading a third semiconductor wafer from the at least one wafer transport container at the loading and unloading station; and transporting, with the transport system, the third semiconductor wafer to the measuring device for an angle-dependent measuring of a scattering or a diffraction of light in dependence on the warning signal generated subsequent to measuring the first critical dimension of the at least one feature.

Another mode of the method according to the invention includes the step of transporting, with the transport system, the first semiconductor wafer from the scanning electron microscope to the measuring device for an angle-dependent measuring of a scattering or a diffraction of light in dependence on a warning signal generated subsequent to measuring the first critical dimension of the at least one feature, in order to measure a reference signal assigned to the first critical dimension of the at least one feature.

A further mode of the method according to the invention includes the step of transporting, with the transport system, the second semiconductor wafer from the measuring device for an angle-dependent measuring of a scattering or a diffraction of light to the scanning electron microscope in dependence on a warning signal generated subsequent to measuring the second critical dimension of the at least one feature, in order to perform a further measurement of the second critical dimension of the at least one feature on the second semiconductor wafer.

Another mode of the method according to the invention includes the step of storing a data pair including the reference signal and the first critical dimension of the at least one feature in a database.

A device for the angle-dependent measuring of the scattering or diffraction of light is often referred to as a scatterometer. The invention includes a particularly advantageous combination of such a scatterometer with a scanning electron microscope (SEM). Scatterometers are known from the prior art but are utilized there as stand-alone devices only, either for taking test measurements or with the separate planning of an independent control step for measuring parameters of wafers. This is due to the fact that they typically have a less flexible construction than CD-SEMs, and their measuring time is not substantially shorter.

Recently, a new type of scatterometer has been proposed, for instance in International Publication No. WO 00/58713.

In this type of scatterometer, a light beam is placed on a test point, i.e. one or more features on a semiconductor wafer, at different angles with the aid of a mirror configuration including a rotatable mirror and an ellipsoidal or annular mirror, and the angle-dependent scattering or diffraction of the light beam at the features is measured by a detector. Given this advantageous arranging of the mirrors, only the deflecting reflector must be provided with a motor, as opposed to the usual case where both the specimen and the rotatable deflecting reflector must be moved, which is complicated. As a result, on one hand, the scatterometer can be compact, and on the other hand, a scattering or diffraction measurement takes only 5 seconds.

As described in International Publication No. WO 00/58713, a measurement of the critical dimension of the feature takes place in the device for the angle-dependent measuring of the scattering or diffraction of light-by the capturing—that is to say, measuring—of the scattering or diffraction signal, whereby in this case the area including the feature on the surface of the semiconductor wafer is on the order of 1 mm$^2$. The feature is advantageously a periodically arranged structure such as may occur in memory products but also in logic products. With the measuring of the critical dimension of the same feature through the use of a scanning electron microscope or comparable high-resolution device, the measured width, spacings, edge angle, and so on, are allocated to the measuring signal, which is considered in the following as a reference signal in a reference library.

A matrix type reference library is built by the parallel measuring of the measuring signals by scatterometers and of the appertaining feature widths and so on by scanning electron microscopes, for a matrix of exposure parameters on the wafer such as focus and intensity (what is known as the focus-exposure matrix), which respectively influence the critical dimension of the feature, among other things. Assuming an identical feature configuration, i.e. an identical wafer product, it is thus possible to pick up a measuring signal for an additional wafer through the use of the same scatterometer, to find the reference signal in the library most closely resembling the measuring signal by correlation, and finally to allocate to the feature the critical dimension of the (reference) feature that is assigned to the reference signal. With the above described procedure, the critical dimension of a feature is measured with the aid of the device for measuring the angle-dependent scattering or diffraction of light.

According to the invention, the advantages of the scanning electron microscope and the scatterometer (i.e. the scanning electron microscope's greater precision and ability to build a library, and the scatterometer's greater throughput and flexibility) are exploited by a common handling or transport system. This makes it possible to jointly plan the measuring of lots. Ideally, a buffer station in which wafers that are awaiting measuring can be temporarily stored is located in the region of the transport system that carries the wafers from a loading station (loadport) to either the scanning electron microscope or the scatterometer. If one of the two measuring devices reports the release of measuring capacity, then the wafer that is to be measured next can be immediately transported to this device by the handling system.

According to the invention, the scanning electron microscope and scatterometer can be expediently integrated in a common configuration with the transport system and advantageously (though not necessarily) with the mini-environment. In any case; a substantially static utilization model is defined by the typically heavy weight of the SEM portion of the configuration nowadays and by its outer dimensions.

A particularly advantageous aspect of the measuring configuration is the possible compactness and portability of the scatterometer. For the production of semiconductor wafers with a size of 300 mm, what are known as Front Opening Unified Pods (FOUP) are usually utilized. The mechanical characteristics of the FOUPs are standardized, for instance the SEMI (Semiconductor Equipment And Materials International) standards E19 for housing dimensions or E15 for interfaces at the loading and unloading stations (loadports) to the fabrication devices, or E57 for what are known as kinematic coupling pins for placement of the FOUPs. In a preferred embodiment, the interface of the scatterometer to the transport system is configured such that this can dock at the loadports, which correspond to the above mentioned SEMI standards, instead of a wafer transport container (FOUP). For measuring purposes, the transport system then executes the unloading function of a wafer out of a wafer transport container at a first loading and unloading station, and then carries the wafer to the second loading and unloading station, at which the scatterometer is docked.

Given the existence of additional loading and unloading stations, additional scatterometers which correspond to the relevant interface standards can be docked as needed. In an advantageous development, the measuring configuration has at least 3, ideally 4, loading and unloading stations, of which one is occupied by the scatterometer, and two others are occupied by wafer transport containers that are parallel-processed. This guarantees that additional wafers are always available for measuring for purposes of increasing the capacity utilization of the measuring configuration.

Another advantage results from the common database to which the scanning microscope and the scatterometer are linked. The database contains at least the reference library, which can be constantly expanded by additional measurement pairs resulting from the feature width measurements of the SEM and the capture of the measuring signal from the scatterometer. On the other hand, it also serves for the measuring of the feature widths and so on by the scatterometer, which needs the library in order to perform the correlation for finding the approximate feature width. Ideally, the database is also connected to a neural network, which is trained with the data coming in from the scanning electron microscope for evaluating a measuring signal (a reference signal) that is picked up by the scatterometer.

The measuring configuration also includes a control unit, which, besides handling the controlling of the transport system, also handles the planning jobs for distributing the wafers to the scanning electron microscope or scatterometer. This also involves case discriminations depending on which measuring results are achieved in which of the two devices. In the simplest case, given a violation of specifications of a feature width tolerance, the wafer is discharged and sent for reworking. But another possibility is that the violation gives rise to a signal that prompts the control unit to transport the wafer over the transport system to another measuring device for measuring by same for the purpose of expanding the library, that is to say, further training the neural network.

In another embodiment, the signal prompts the control unit to modify the planning strategy of the at least two devices. For instance, if it emerges from measurements by the scatterometer that problems repeatedly arise, there can be a shift to a targeted checking of all subsequent wafers in the scanning electron microscope in order to test the correctness of the scatterometer measurements, on one hand, and to get to the bottom of the potential cause, on the other hand. By combining the two measuring devices, it is possible to create specific recipes, i.e. control instructions for measuring, which define, in consideration of the specific measuring times, how many wafers should be evaluated in the scanning electron microscope and the scatterometer, respectively, and under what conditions the strategies are to be modified in an isolated case.

It is possible to measure all wafers of a lot in less time with the measuring configuration according to the invention in connection with the relevant method for applying the measuring configuration and, as a result, a throughput increase as well as an enhanced certainty of uniformity from one wafer to the next in a lot can both be achieved. In particular, it is no longer necessary to implement lot sampling strategies for economic reasons.

Other features which are considered as characteristic for the invention are set forth in the appended claims.

Although the invention is illustrated and described herein as embodied in a measuring configuration for measuring a critical dimension of at least one feature on a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic view of a measuring configuration according to the invention with 4 loadports, one of which is occupied by a FOUP, and another one by the scatterometer;

FIG. 2 is a schematic diagram for illustrating an exemplary embodiment of a method for increasing the throughput in the CD measuring process in accordance with the invention; and FIG. 3 is a flow diagram for illustrating a further exemplary embodiment of a method for increasing the certainty of wafer-to-wafer uniformity in accordance with the invention.

DESCRIPTION OF THE PREFERRED EMBODIMENTS

Referring now to the figures of the drawings in detail and first, particularly, to FIG. 1 thereof, there is shown an example of a measuring configuration according to the invention. A scanning electron microscope 2 is served by a transport system 4 for the purpose of measuring semiconductor wafers 1 in a common region of a mini-environment. The transport system 4 works in a handling region 4' which is connected by way of interfaces 5' to loading and unloading stations 5 (hereinafter loadports). In order to produce a mini-environment, i.e. a substantially lower density of contaminating particles per air space, the interfaces 5' are open only in the event of a loading or unloading operation. Installed on one of the loadports 5 is a scatterometer 3, what is known as a Φ-scatterometer, in which the azimuthal angle of the beam incident on the specimen is varied through the use of an annular mirror. Alternatively, a 2-θ-scatterometer can be utilized. The loadports 5 and the interfaces 5' correspond to the abovementioned SEMI standards, and the load side of the Φ-scatterometer 3 corresponds to the relevant SEMI standard of a FOUP 6 as the wafer transport container. Via the corresponding interface 5', the Φ-scatterometer is accessible to the transport system 4 in the handling region 4' for the loading and unloading of semiconductor wafers 1.

FIG. 1 also includes a FOUP 6 on a middle loadport of the loadports 5, which can be loaded or unloaded by way of the interface 5'. The transport system 4 handles all wafer transports between the FOUP 6, the SEM 2, and the Φ-scatterometer 3. By virtue of a substantially air-tight seal such as corresponds to the SEMI standards, the three wafer stations above are located in a common mini-environment.

The loading and unloading function and the transport of semiconductor wafers 1 by the transport system 4 are controlled by a control unit 7. The control unit 7 also includes a computing unit, in which a plan for the distribution of semiconductor wafers 1 from the FOUP 6 can be created from stored anticipated processing times in the SEM 2 and the Φ-scatterometer 3, so that an optimal capacity utilization of the measuring configuration is guaranteed. Located in the wafer transport region 4' is a buffer capacity 10 for receiving semiconductor wafers 1 which are in a waiting position for processing in the SEM 2 or Φ-scatterometer 3. The advantage of this is that, when measuring capacity is released, the next semiconductor wafer can be loaded into the relevant measuring device relatively quickly. Another advantage is that, given docking of an additional FOUP 6 on an additional loadport 5, the measuring of the semiconductor wafers 1 which form a new lot and which are contained in the additional FOUP 6 can be followed up seamlessly with the aid of the buffer. Furthermore, different measurement strategies, such as are described below, can be followed for the two lots of the two FOUPs 6.

Also connected to the control unit 7 is a database 8, which includes the reference library of measuring signals and reference widths of the predetermined features as verified with an SEM. The inventive realization either of a control logic of the SEM 2 and the Φ-scatterometer 3 in addition to the control unit 7, or of an integrated control logic of the measuring devices in the control unit 7, makes possible a data coupling or data access to the database 8 for both the SEM 2 and the Φ-scatterometer 3. The SEM 2 writes its reference measuring results for the feature widths onto the corresponding database entries for the reference signals that are measured in the Φ-scatterometer 3. On its part, the Φ-scatterometer enters its measured reference signals as well as the measuring signals of widths 21 of features 22 on semiconductor wafers 1 of the production which are presently to be determined into the database 8, and uses the reference signals for a correlation in order to find the corresponding feature width entry of the reference with the aid of the most closely correlating reference signal, and to allocate it to the present width 21 of the feature 22. The feature 22 is only schematically illustrated.

FIG. 2 represents a first exemplifying embodiment of the method according to the invention. Analogously to the conventional sampling strategy, three semiconductor wafers 1 from the 25-wafer lot which is removed from the FOUP 6 are fed to the SEM 2 over the transport system 4, in order to obtain a high-precision measurement. Hardly 3 minutes total are required for measuring the 3 semiconductor wafers 1. Instead of having the remaining twenty-two wafers 1 wait for the result of the measurement of the first three semiconductor wafers 1 as in the conventional method, here these are successively fed to the Φ-scatterometer 3. A measuring time of some 5 seconds and a loading and unloading time of 10 seconds are required for the individual semiconductor wafers 1, so that the measuring of the widths 21 takes some 5 minutes. Once measured, all semiconductor wafers 1 are successively reloaded into the FOUP 6 waiting on the loadport 5 by the transport system 4. Assuming that, as is usually the case, the percentage of semiconductor wafers in the SEM 2 that do not correspond to the defined specification tolerances with respect to the measured widths 21 of the features 22 is not infinitesimal, it is advantageous in the method according to the invention with the aid of the measuring configuration according to the invention that an indication—albeit a somewhat rough one—of the widths 21 of the features 22 is provided for each of the additional twenty-two measured semiconductor wafers 1. In contrast, in the conventional instance, a larger sample must be examined with the SEM 2 as a result of the specification violation, which is complicated. With the inventive measuring configuration, a time advantage is inevitably gained on average. With the addition of another Φ-scatterometer 3, the remaining twenty-two semiconductor wafers 1 can even by split into two groups of eleven wafers 1 each, so that in this example the SEM 2 forms the bottleneck for the wafer throughput. Given the measuring of each semiconductor wafer 1, more-precise statistical information about the entire lot is thus available, and problems caused in previous processing steps can be detected more easily.

FIG. 3 represents another exemplary embodiment of a method according to the invention. A loop in the top part of the flowchart provides for the successive unloading of each semiconductor wafer 1 from a FOUP 6 that is docked at a loadport 5. The transport system 4 carries each of these wafers 1 into a buffer station 10 that is set up in the transport region 4'. The control unit 7 receives the information that free measuring capacity exists through the use of signals from both the SEM 2 and the Φ-scatterometer 3. Depending on which measuring device this signal comes from, a respective semiconductor wafer 1 is loaded into the relevant device for further measuring. On both sides, the width 21 of the feature 22 on the semiconductor wafer 1 is measured as specified by the respective measuring methods.

The measured width 21 of the feature 22 is then compared on both sides to reference values; i.e., the specification value with tolerance values. If these tolerances have been maintained, the next processing steps can be executed for this semiconductor wafer 1 following the execution of the required discharging steps and the final loading of the FOUP 6. This exemplifying embodiment is particularly advantageous in case of a violation of specifications by the measured feature 22 on the present semiconductor wafer 1.

If this violation of specifications is detected on the SEM 2 side, a warning signal 30 is generated, which prompts the control unit 7 to check whether a measurement has already been taken by the Φ-scatterometer, so that a measuring signal exists. The object of this step is to document this case of a specification violation in the database 8 by making an entry in the reference library, and to train a neural network if one is provided. Accordingly, in this case the measured width 21 of the feature 22 and the appertaining measuring signal from the Φ-scatterometer 3 are entered into the database 8 as reference values. If, on the other hand, a measuring signal does not yet exist, the transport system 4 carries the semiconductor wafer 1 from the SEM 2 to the Φ-scatterometer 3, where the measuring signal is picked up. Omitted from FIG. 3 for the sake of clarity are the subsequent return to the FOUP 6 of this semiconductor wafer 1 that violates the specification, and the required database entry. Similarly, in this case the specification comparison on the side of scatterometer 3 is not required, it being assumed that the SEM 2 can perform a more accurate measurement of the width 21 of the feature 22 than the Φ-scatterometer 3. A test can also be performed with respect to whether a substantially identical specification violation with an approximately equal width 21 of the feature 22 and an approximately identical measuring signal has not already occurred, so that redundancies are not created in the database 8 by an additional entry.

If a specification violation is detected upon measurement by the scatterometer 3, the transport system 4 is prompted by the control unit 7 to carry the semiconductor wafer 1 from the scatterometer 3 into the SEM 2, without a verification of the specification violation being performed there.

What these measures accomplish is that, on one hand, the wafer throughput in the CD measuring step is higher, and on the other hand, if problems arise, a rapid automatic verification of the specification violation is possible with the aid of a respective double-check, and the degree of certainty of a specified wafer-to-wafer uniformity for a lot is appreciably increased.

In another exemplary embodiment, an analogous method can be carried out whereby a plurality of lots are processed in parallel fashion. For instance, a first wafer from a first lot is evaluated in the SEM 2, while all semiconductor wafers 1 from a second lot are successively checked in the scatterometer 3. If this correlation is successful, then either one or more semiconductor wafers 1 of the second lot can be evaluated in the SEM 2 for collecting further data in the reference library, or, as described above, the warning signal 30 following the comparison to the reference value in the scatterometer 3 can simply be utilized as a criterion for the further processing of the corresponding semiconductor wafers 1. This of course presumes that the semiconductor wafers 1 of the first and second lots represent the same product.

I claim:

1. A measuring configuration for measuring a semiconductor wafer having at least one feature with a critical dimension, comprising:
   a scanning electron microscope for measuring the critical dimension of the at least one feature of the semiconductor wafer;
   at least one measuring device for an angle-dependent measuring of one of a scattering and a diffraction of light at the at least one feature of the semiconductor wafer;
   at least one loading and unloading station for loading and unloading wafer transport containers receiving the semiconductor wafer;
   a transport system for transporting the semiconductor wafer, said transport system having transport paths including at least a respective transport path between said at least one loading and unloading station and said scanning electron microscope, and between said at least one loading and unloading station and said at least one measuring device for an angle-dependent measuring of one of a scattering and a diffraction of light; and
   a control unit operatively connected to said transport system, said control unit selecting and controlling one of said transport paths of said transport system in order to selectively make the semiconductor wafer available to said at least one measuring device for an angle-dependent measuring of one of a scattering and a diffraction of light and to said scanning electron microscope.

2. The measuring configuration according to claim 1, including a database operatively connected to said at least one measuring device for an angle-dependent measuring of one of a scattering and a diffraction of light, said data base storing a reference signal for an angle-dependent measurement of one of a scattering and a diffraction of light at at least one reference feature.

3. The measuring configuration according to claim 2, wherein said scanning electron microscope is operatively connected to said database in order to store a critical dimension of the at least one reference feature and a measuring signal in a common record.

4. The measuring configuration according to claim 3, wherein said control unit includes a computing unit for correlating a measuring signal, measured with said at least one measuring device for an angle-dependent measuring of one of a scattering and a diffraction of light, with at least one reference signal stored in said database.

5. The measuring configuration according to claim 1, wherein:
said at least one loading and unloading station includes a first loading and unloading station and a second loading and unloading station, said first and second loading and unloading stations are configured to communicate with a same one of said transport containers;
said first loading and unloading station is set up as an interface between said transport system and said at least one measuring device for an angle-dependent measuring of one of a scattering and a diffraction of light; and
said at least one measuring device for an angle-dependent measuring of one of a scattering and a diffraction of light is connected to said transport system via said interface for performing a measurement of the semiconductor wafer.

6. The measuring configuration according to claim 1, wherein said transport system includes a region with a buffer station for receiving the semiconductor wafer during a waiting period.

7. A method for measuring a critical dimension of at least one feature on at least two substantially identical semiconductor wafers, the method which comprises:
providing a plurality of semiconductor wafers in at least one wafer transport container;
unloading a first semiconductor wafer at a loading and unloading station;
transporting, with a transport system, the first semiconductor wafer to a scanning electron microscope;
measuring a first critical dimension of the at least one feature on the first semiconductor wafer with the scanning electron microscope;
unloading a second semiconductor wafer at the loading and unloading station;
transporting, with the transport system, the second semiconductor wafer to a measuring device for an angle-dependent measuring of one of a scattering and a diffraction of light;
measuring a second critical dimension of the at least one feature on the second semiconductor wafer with the measuring device for an angle-dependent measuring of one of a scattering and a diffraction of light;
comparing the first critical dimension to a reference value;
comparing the second critical dimension to the reference value;
generating a warning signal in dependence on results of the comparing steps;
transporting the first and second semiconductor wafers back to the loading and unloading station; and
loading the at least one wafer transport container with the first and second semiconductor wafers.

8. The method according to claim 7, which comprises:
unloading a third semiconductor wafer from the at least one wafer transport container at the loading and unloading station;
transporting the third semiconductor wafer to a buffer station;
checking, with a control unit, whether the scanning electron microscope is available for a further measuring; and
transporting, in dependence on a result of the checking step, the third semiconductor wafer to the scanning electron microscope for measuring a third critical dimension of the at least one feature.

9. The method according to claim 7, which comprises:
unloading a third semiconductor wafer from the at least one wafer transport container at the loading and unloading station;
transporting the third semiconductor wafer to a buffer station;
checking, with a control unit, whether the measuring device for an angle-dependent measuring of one of a scattering and a diffraction of light is available for a further measuring; and
transporting, in dependence on a result of the checking step, the third semiconductor wafer to the measuring device for an angle-dependent measuring of one of a scattering and a diffraction of light, in order to measure a third critical dimension of the at least one feature.

10. The method according to claim 7, which comprises:
unloading a third semiconductor wafer from the at least one wafer transport container at the loading and unloading station; and
transporting, with the transport system, the third semiconductor wafer to the scanning electron microscope in dependence on the warning signal generated subsequent to measuring the first critical dimension of the at least one feature.

11. The method according to claim 7, which comprises:
unloading a third semiconductor wafer from the at least one wafer transport container at the loading and unloading station; and
transporting, with the transport system, the third semiconductor wafer to the measuring device for the angle-dependent measuring of one of a scattering and a diffraction of light in dependence on the warning signal generated subsequent to measuring the first critical dimension of the at least one feature.

12. The method according to claim 7, which comprises transporting, with the transport system, the first semiconductor wafer from the scanning electron microscope to the measuring device for an angle-dependent measuring of one of a scattering and a diffraction of light in dependence on the warning signal generated subsequent to measuring the first critical dimension of the at least one feature, in order to measure a reference signal assigned to the first critical dimension of the at least one feature.

13. The method according to claim 7, which comprises transporting, with the transport system, the second semiconductor wafer from the measuring device for an angle-dependent measuring of one of a scattering and a diffraction of light to the scanning electron microscope in dependence on the warning signal generated subsequent to measuring the second critical dimension of the at least one feature, in order to perform a further measurement of the second critical dimension of the at least one feature on the second semiconductor wafer.

14. The method according to claim 12, which comprises storing a data pair including the reference signal and the first critical dimension of the at least one feature in a database.

* * * * *